US010411495B2

(12) United States Patent
Tuerk et al.

(10) Patent No.: US 10,411,495 B2
(45) Date of Patent: Sep. 10, 2019

(54) SYSTEM FOR THE MONITORING AND MAINTENANCE OF REMOTE AUTONOMOUSLY POWERED LIGHTING INSTALLATIONS

(71) Applicant: CLEAR BLUE TECHNOLOGIES INC., Toronto (CA)

(72) Inventors: John Tuerk, Toronto (CA); Miriam Tuerk, Toronto (CA); Mark Windrim, Toronto (CA); Ahmad Yafaoui, Toronto (CA)

(73) Assignee: CLEAR BLUE TECHNOLOGIES INC., Toronto ON (CA)

(*) Notice: Subject to any disclaimer, the term of this patent is extended or adjusted under 35 U.S.C. 154(b) by 193 days.

(21) Appl. No.: 15/606,633

(22) Filed: May 26, 2017

(65) Prior Publication Data

US 2017/0331322 A1 Nov. 16, 2017

Related U.S. Application Data

(63) Continuation of application No. 14/406,916, filed as application No. PCT/CA2013/000543 on Jun. 4, (Continued)

(30) Foreign Application Priority Data

Jun. 13, 2012 (CA) .................................... 2779896

(51) Int. Cl.
*H02J 7/04* (2006.01)
*H02J 50/80* (2016.01)
(Continued)

(52) U.S. Cl.
CPC ............... *H02J 7/042* (2013.01); *H02J 1/08* (2013.01); *H02J 1/10* (2013.01); *H02J 7/35* (2013.01);
(Continued)

(58) Field of Classification Search
CPC .. G01R 31/40; H02J 13/0017; H02J 13/0062; H02J 13/0075; H02J 1/08; H02J 1/10;
(Continued)

(56) References Cited

U.S. PATENT DOCUMENTS 4,200,904 A 4/1980 Doan
4,710,977 A 12/1987 Lemelson
(Continued)

OTHER PUBLICATIONS

Pierce et al. "Regional and on-farm wireless sensor networks for agricultural systems in Eastern Washington" Computers and Electronics in Agriculture 61 (2008) 32-43.
(Continued)

*Primary Examiner* — John H Le (57) ABSTRACT

A system of monitoring and/or maintaining remotely located autonomously powered lights, security systems, parking meters, and the like is operable to receive data signals from a number of the devices, and provide a comparison with other similar devices in the same geographic region to detect a default condition of a particular device, and/or assess whether the defect is environmental or particular to the specific device itself. The system includes memory for storing operating parameters and data, and outputs modified control commands to the devices in response to sensed performance, past performance and/or self-learning algorithms. The system operates to provide for the monitoring and/or control of individual device operating parameters on an individual or regional basis, over preset periods.

23 Claims, 6 Drawing Sheets

Related U.S. Application Data 2013, now Pat. No. 9,780,602, which is a continuation-in-part of application No. 13/507,318, filed on Jun. 21, 2012, now Pat. No. 9,236,762.

(51) Int. Cl.
| | | |
|---|---|---|
| *H05B 37/02* | (2006.01) | |
| *H05B 37/03* | (2006.01) | |
| *H02J 1/08* | (2006.01) | |
| *H02J 1/10* | (2006.01) | |
| *H02J 7/35* | (2006.01) | |
| *H02J 13/00* | (2006.01) | |
| *H05B 37/00* | (2006.01) | |
| *G01R 31/40* | (2014.01) | |
| *H02J 3/38* | (2006.01) | |

(52) U.S. Cl.
CPC .......... *H02J 7/355* (2013.01); *H02J 13/0017* (2013.01); *H02J 13/0062* (2013.01); *H02J 13/0075* (2013.01); *H05B 37/00* (2013.01); *H05B 37/0227* (2013.01); *H05B 37/0272* (2013.01); *H05B 37/034* (2013.01); *G01R 31/40* (2013.01); *H02J 3/386* (2013.01); *Y02B 90/2653* (2013.01); *Y02E 10/763* (2013.01); *Y02E 40/72* (2013.01); *Y04S 10/123* (2013.01); *Y10T 307/344* (2015.04)

(58) Field of Classification Search
CPC .... H02J 3/386; H02J 7/042; H02J 7/35; H02J 7/355; H05B 37/00; H05B 37/0227; H05B 37/0272; H05B 37/034; Y02B 90/2653; Y02E 10/763; Y02E 40/72; Y04S 10/123; Y10T 307/344

USPC ........ 702/58, 60, 62, 63, 182, 183; 362/145, 362/183; 700/90, 286, 295

See application file for complete search history.

(56) References Cited

U.S. PATENT DOCUMENTS

| | | |
|---|---|---|
| 6,351,130 B1 | 2/2002 | Preiser |
| 7,731,383 B2 | 6/2010 | Myer |
| 7,976,180 B1 | 7/2011 | Haun |
| 8,010,319 B2 | 8/2011 | Walters |
| 9,367,052 B2 * | 6/2016 | Steven .................. G06Q 50/06 |
| 2007/0208537 A1 | 9/2007 | Savoor |
| 2009/0144000 A1 | 6/2009 | Herzig |
| 2009/0261785 A1 | 10/2009 | Cabot |
| 2010/0029268 A1 | 2/2010 | Myer |
| 2010/0090605 A1 | 4/2010 | Nevins |
| 2010/0217550 A1* | 8/2010 | Crabtree ................ H02J 3/005 702/62 |
| 2010/0271199 A1 | 10/2010 | Belov |
| 2010/0292815 A1 | 11/2010 | Pan |
| 2011/0127916 A1 | 6/2011 | Kim |
| 2012/0020060 A1 | 1/2012 | Myer |
| 2012/0101644 A1 | 4/2012 | Evans |
| 2012/0143383 A1 | 6/2012 | Cooperrider |
| 2013/0245883 A1 | 9/2013 | Humphrey |

OTHER PUBLICATIONS

Huang et al. "Wireless Sensor Network for Streetlight Monitoring and Control" Digital Wireless Communications VI, Proceedings of SPIE vol. 5440, SPIE, Bellingham, W, 2004.

* cited by examiner

SYSTEM FOR THE MONITORING AND MAINTENANCE OF REMOTE AUTONOMOUSLY POWERED LIGHTING INSTALLATIONS

RELATED APPLICATIONS

This application is a continuation of U.S. patent application Ser. No. 14/406,916, filed 4 Jun. 2013, which is the National Stage International Application No. PCT/CA2013/000543, filed 4 Jun. 2013, and which is a continuation-in-part of a U.S. patent application Ser. No. 13/507,318, filed 21 Jun. 2012, now U.S. Pat. No. 9,236,762 B2.

This application is related to U.S. patent application Ser. No. 14/957,929, filed 3 Dec. 2015.

SCOPE OF THE INVENTION

The present invention relates to a system for the remote monitoring of an autonomous power generating apparatus, and more particularly a system for the monitoring and maintenance of remote lighting and/or security or video installations which may be photovoltaic, wind turbine and/or other direct current source powered.

BACKGROUND OF THE INVENTION

The use of powered lighting installations is becoming more and more prevalent. Such installations have proven highly effective, particularly when used in remote locations where conventional electrical grid access is not commercially feasible.

Various third parties, such as United States Patent Publication No. US 2010/0029268 A1 to Myer, published 4 Feb. 2010, have disclosed systems for monitoring and controlling solar powered light installations remotely. In the system developed by Myer, a number of solar powered light poles are provided to wirelessly transmit and receive from a remote controller, information relating to grid usage and/or power outages. The remote controller may be used to activate LED lights on the poles and/or if connected to the grid, supply photovoltaic generated power back into the grid in the case of high load applications.

The applicant has appreciated, however, that by their nature, the installation of remotely located solar and/or wind powered lighting and other autonomously powered installations presents a unique problem from the point of view of servicing. With conventional solar installation monitoring systems, when a fault or low performance signal is transmitted from a particular solar light pole, the remote location of the solar light pole prevents, on a cost efficiency basis, service technicians from undertaking an initial on-site visit to diagnose the problem. As a result, the manufacturer/maintenance organization will in the first instance, forward replacement parts or components to rectify the perceived "defect". As a result, light pole repairs are often undertaken which are either inefficient or unnecessary where, for example, low power output or insufficient battery charge results from environmental conditions, such as prolonged periods of cloud cover, or dirt or other organic growth covering photovoltaic cells or other electricity generating components.

SUMMARY OF THE INVENTION

The present invention therefore provides for a system of monitoring and/or maintaining remotely located autonomously powered devices. Such devices may include, without restriction, photovoltaic and/or wind powered lights, security systems (video cameras, motion detectors, and/or infrared lights), parking meters, charging stations, bike rental platforms and/or cellular or radio transmitters, as well as other wind turbine or power generation installations.

In one mode of operation, the system is operable to receive data signals from a number of the devices, and on detecting a default condition of a particular device, provide a comparison with other similar devices in the same geographic region to assess whether the defect is in fact environmental to devices in a given geographic region, or rather particular to the specific device itself. In another mode of operation, the system is operable to receive data signals from a number of the devices, and on detecting a default condition of a particular device, provide a comparison with other devices of similar technical and situational configuration (across multiple geographies) to assess whether the defect is in fact environmental to components of devices of a given configuration, or rather particular to the specific device itself. In a most preferred mode, data is received and analyzed by a suitable controller such as a processor, and most preferably wirelessly by a central processor which is used in the monitoring and control of a number of separate geographically remote installation sites.

Another mode of the invention provides a system for the monitoring and/or control of an array of autonomous self-powered devices, such as solar and/or wind powered lights, security cameras, display boards, environmental sensors, telecommunications and the like, and which are typically powered at least in part, by a rechargeable battery or fuel cell (hereinafter the battery). The system is operable to provide for the monitoring and/or control of individual device operating parameters on an individual basis, on a regional basis, or through other groupings such as technical parameters (e.g. by versions of technology) over a preset period of time for day to day operational control, prescheduled maintenance, preventive maintenance, emergency maintenance and life cycle maximization. Although not essential, more preferably, the system includes memory for storing such operating parameters and data. The system may in one embodiment, thus, provide for self-learning algorithms from an analysis of past data, extrapolate future device operating performance expectations and/or parameters, and output modified control commands to the devices in response to the past performance and/or self-learning algorithms remotely.

In yet another possible mode of control data to the individual solar lights or other load sources of each installation site is weighted or adjusted having regard to either short term projected weather forecasts or events and/or projected seasonal average or long term forecasts.

In one possible embodiment, environmental conditions such as earlier weather events (sun position, temperature, UV intensity, fog, snow, etc.) are logged and compared against past site power generation and/or load performance. The generation and/or load data is then stored as part of a predictive model to anticipate similar generation and/or load performance values for like weather events moving forward. In a most preferred embodiment, the current operational performance of a site installation is weighted by having regard to past performance during such events and/or controlled predictively having regard to future/current events.

By way of non-limiting example, where a short term forecast for an installation site at a particular geographic region predicts an upcoming period of inclement weather or rain and cloud cover with high wind velocities, and which for example is characterized as likely to result in increased power generation by the installation site wind turbines, control signals may be sent to the installation site to operation power load with increased output intensity and/or time of operation to reflect the reduced visibility during times of increased power output from turbine generators.

Similarly where short term forecast data is provided which is indicative of a predicted time period of both lower wind velocity and solar energy generation, as for example on the occurrence of fog and/or extended periods of rain in the absence of significant winds, a control signal may be output to the installation to reduce the operation times and/or intensity of the loads, as for example by reducing the lumen output of solar lights and/or their activation times to reflect any reduced re-charging.

In addition to short term environmental factors, the output control to the load devices at each installation site may also be regulated by events such as seasonal environmental and/or weather trend factors. By way of example, in northern latitude regions in the spring and fall which are typically characterized by periods of sustained increased winds, the controller may be used to provide control the output loads to increase power output, provide overall brighter lighting and/or longer periods of operation either before complete sunset and/or after complete sunrise, and which would reflect the increased battery recharge capacity attributable to increased wind turbine efficiencies. Similarly during seasonal periods of reduced sunlight exposure and/or the increased tangential impact of solar relative to the solar panel, the controller may be used to provide signals to control the system to provide for the intermittent, selective and/or shortened operation of individual load devices, reduce the overall load intensity of the installation site and/or output times to reflect slower battery recharge capacity.

According to various non-limiting embodiments, the present invention resides in at least the following aspects:

1. A maintenance monitoring system for monitoring an operating status of electrical loads and operating parameters of a plurality of autonomously powered discrete devices, said discrete devices being disposed as part of an array located at a first geographic region, the system further including a processing device provided in a second geographic region remote from said first region, each discrete device comprising at least one associated electric load, a generator for generating electricity, a battery for storing electricity produced by said generator and providing electric power to said at least one associated load, a device controller for regulating or controlling a flow of electric power from said generator to said battery and from said battery to said at least one associated load, and a data transmission assembly operable to transmit output data representative of the operating parameters of each of the power generation performance, the battery storage or discharge performance and the at least one associated load, memory for storing said output data of each said discrete device in said array, the processing device being actuable to: compile said output data stored in said memory to determine a regional operating profile for said array for at least one of average power generation performance and average battery storage or discharge performance over a selected period of time, and compile said output data stored in said memory to determine device operating profiles for a selected one of said discrete devices for at least one device power generation performance, and device battery storage or discharge performance over said selected period of time, compare at least one said regional operating profile and at least one said device operating profile, and output a data signal if the compared device operating profile falls outside a predetermined threshold difference from the at least one said regional operating profile, the data signal being indicative of a potential maintenance requirement for said selected discrete device.

2. A maintenance monitoring system for a solar light installation, the system comprising, a solar light array comprising a plurality of discretely powered solar light poles operationally disposed in a first geographic region, a processing assembly being disposed in a second geographic region remote from said first region, and memory, each solar light pole having a power generator including at least one photovoltaic panel, a light providing an electrical load, a battery for receiving and storing electricity generated by the photovoltaic panel, a pole controller for controlling the power charging and discharge of the battery and at least one of the operating time and intensity of said light, at least one sensor selected from the group consisting of an anemometer, a photovoltaic sensor, a pollution sensor, a wind vane, an environmental sensor and a battery temperate sensor and a data transmission assembly operable to wirelessly communicate output data both from said at least one sensor and data representative of the power generator performance and battery charging and discharge performance, the memory provided for storing the output data for each light pole in the solar light array, the processing assembly being actuable to: compile said output data stored in said memory to determine a regional operating profile for said array for at least one of aggregate power generation performance and aggregate battery storage or discharge performance over a selected period of time, and compile said output data stored in said memory to determine device operating profiles for a selected one of said discrete devices for at least one device power generation performance, and device battery storage or discharge performance over said selected period of time, compare at least one said regional operating profile and at least one said device operating profile, and output a data signal if the compared device operating profile falls outside a predetermined threshold difference from the at least one said regional operating profile, the data signal being indicative of a potential maintenance requirement for said selected discrete device.

3. A system for monitoring an operating status of a plurality of autonomously powered discrete devices, devices selected from one or more of the group consisting of light poles, security camera installations, parking meters, charging stations, bike rental platforms, display boards, environmental sensors, and telecommunication installations, said discrete devices being disposed in an array located at a first geographic region, the system further including a processing assembly provided at a second geographic region remote from said first region, each discrete device comprising a plurality of associated electric loads, a generator for generating electricity, a battery for storing electricity produced by said generator and providing electric power to said plurality of loads, a device controller for controlling a flow of charging electric power from said generator to said battery and discharge power from said battery to said electric loads, and a data transmission assembly, the data transmission assembly being operable to transmit output data representative of the operating parameters of the power generation performance of the generator, the storage or discharge performance of the battery and the load status of the associated electric loads, memory for storing said output data from each said discrete device in said array, and the processing assembly is operable to: compile said output data stored in said memory to determine regional operating profiles for aggregate power generation performance of said array and aggregate battery storage and/or discharge performance of said array over a selected period of time, and compile said output data stored in said memory to determine device operating profiles for a selected one of said discrete devices for device power generation performance of selected device, and device battery storage or discharge performance for the selected device over said selected period of time, compare at least one said regional operating profile and at least one said device operating profile, and output a data signal if the compared device operating profile falls outside a predetermined threshold difference from the at least one said regional operating profile.

4. A maintenance monitoring system for monitoring an operating status of electrical loads and operating parameters of a plurality of autonomously powered discrete devices, said discrete devices being disposed as part of an array located at a first geographic region, the system further including a processing device provided in a second geographic region remote from said first region, each discrete device comprising at least one associated electric load, a generator for generating electricity, a battery for storing electricity produced by said generator and providing electric power to said at least one associated load, a device controller for regulating or controlling a flow of electric power from said generator to said battery and from said battery to said at least one associated load, and a data transmission assembly operable to transmit output data representative of the operating parameters of each of the power generation performance, the battery storage or discharge performance and the at least one associated load, the data transmission assembly being operable to receive input control signals to at least one said discrete device to effect a change in said flow of electricity by said device controller, memory for storing said output data of each said discrete device in said array, the processing device being actuable to: compile said output data stored in said memory to determine a regional operating profile for said array for at least one of average power generation performance and average battery storage or discharge performance over a selected period of time, compile said output data stored in said memory to determine device operating profiles for a selected one of said discrete devices for at least one device power generation performance, and device battery storage or discharge performance over said selected period of time, compare at least one said regional operating profile and at least one said device operating profile, and the processing device being operable to output said input device control signals to the selected discrete device in response to at least one of the compared at least one regional operating profile and the at least one device operating profile, and the compiled environmental data.

5. A system according to any one of the foregoing aspects, wherein the aggregate power generation performance and/or aggregate battery storage or discharge performance is calculated as one or more of an average performance, a mean performance, a median performance and/or a projected or calculated trend performance.

6. A system according to any one of the foregoing aspects, wherein each discrete device includes a plurality of said electric loads, the electric loads comprising at least one of an LED light, a security camera, a bicycle charging stand, or parking meter.

7. A system according to any one of the foregoing aspects, wherein the data transmission assembly is operable to receive and transmit to said device controller input device control signals for controlling the power output of said generator or said battery.

8. A system according to any one of the foregoing aspects, wherein the generator includes a photovoltaic generator comprising a plurality of solar panels.

9. A system according to any one of the foregoing aspect, wherein the generator comprises a combination wind/solar generator including at least one wind turbine and at least one solar panel.

10. A system according to any one of the foregoing aspects, wherein the memory stores further output data representative of the operating parameters of each of the power generation performance and battery storage or discharge performance of a plurality of said discrete devices provided as part of a further array, said further array being disposed at a third geographic location remote from said first geographic location, the processing device being actuable to compile said further output data to determine additional regional operating profiles for said further array, and compare the additional regional operating profiles and at least one of the regional operating profile and the at least one device operating profile.

11. A system according to any one of the foregoing aspects, wherein the discrete devices comprise solar powered lamp posts and the at least one associated load includes at least one light.

12. A system according to any one of the foregoing aspects, wherein the processing device is operable to output input device control signals to the selected discrete device in response to the output data signal.

13. A system according to any one of the foregoing aspects, wherein the output data signal is indicative of at least one of a fault and/or failure of at least one of said generator, said battery and said associated load in the selected discrete device.

14. A system according to any one of the foregoing aspects, comprising a plurality of further arrays located in further geographic regions remote from said first geographic region, each further array comprising a plurality of associated autonomously powered discrete devices, said memory storing further output data representative of the operating parameters of the power generation performance and the battery storage and discharge performance of the associated discrete devices, the processing device operable to compile some or all of the data from said further arrays over a second selected period of time to determine further regional operating profiles, compare the regional operating profile with selected ones of said further regional operating profiles, and output a further data signal if the regional operating profile falls outside a predetermined threshold difference from the selected further regional operating profiles.

15. A system according to any one of the foregoing aspects, wherein said processing assembly is further operable to effect the transmission of programming signals to the device controller of said selected discrete devices to modify at least one operating configuration selected from the group consisting of a configuration of said generator, a charging schedule of said battery, a level of power flowing to said at least one associated load, and an operating schedule of said associated load.

16. A system according to any one of the foregoing aspects, wherein the autonomously powered discrete devices comprise security installations and the at least one associated load is selected from the group consisting of a video sensing camera, an infrared light sensor, and a motion detector.

17. A system according to any one of the foregoing aspects, wherein said output data signal is selected to provide a distinction between operation anomalies resulting from environmental conditions and operation anomalies that result of a hardware failure.

18. A system according to any one of the foregoing aspects, wherein said output data signal is provided as an indication of scheduled maintenance and/or inspection requirements of said selected discrete device.

19. A system according to any one of the foregoing aspects, wherein said discrete devices are selected from the group consisting of parking meters, charging stations, bike rental platforms, display boards, environmental sensors, and telecommunication installations.

20. A system according to any one of the foregoing aspects, wherein at least one of said discrete devices in said array further comprises environmental sensors for detecting at least one environmental parameter selected from the group consisting of temperature, air movement, and light intensity, said data transmission assembly being further operable to transmit data representative of said environmental parameters for storage in said memory.

21. A system according to any one of the foregoing aspects, wherein said data transmission assembly comprises a transmitter selected from the group consisting of Zigbee, cellular, Ethernet, and WiFi.

22. A system according to any one of the foregoing aspects, wherein said processing device is further operable to effect the transmission of testing signals to said discrete devices so as to cause said discrete devices to perform voltage tests and/or short circuit tests.

23. A system according to any one of the foregoing aspects, wherein said output data signal is selected to provide an indication of an operation anomaly resulting from improper installation of said selected discrete device.

24. A system according to any one of the foregoing aspects, wherein said predetermined threshold is adjustable on the basis of a performance history of the maintenance monitoring system and/or an operating history of the discrete devices.

25. A system according to any one of the foregoing aspects, wherein the pole controller is a programmable controller, the processing assembly operable to transmit programme instructions to the data transmission assembly to re-programme the light controller of at least one of said of said solar powered lights, and the aggregate power generation performance and/or aggregate battery storage or discharge performance is calculated as one or more of an average performance, a mean performance, a median performance, and a projected trend performance.

26. A system according to any one of the foregoing aspects, wherein the processing assembly is operable to transmit said programme instructions to the selected light pole in response to the output signal.

27. A system according to any one of the foregoing aspects, wherein the solar powered light array comprises at least ten said light poles, and said first geographic region comprises an area of at least 0.5 hectares, the processing assembly and memory being disposed at geographic regions at least 100 km from the first geographic region.

28. A system according to any one of the foregoing aspects, wherein the electric loads comprise at least one of an LED light, a security camera, a bicycle charging stand, a parking meter, a display, and a wireless telecommunication transmitter, and the aggregate power generation performance and/or aggregate battery storage or discharge performance is calculated as one or more of an average performance, a mean performance, a median performance, and a projected trend performance.

29. A system according to any one of the foregoing aspects, wherein the data transmission assembly is operable to receive and transmit to said device controller input device control signals for controlling the power output of said generator or said battery, the generator including at least one solar panel and at least one wind turbine generator.

30. A system according to any one of the foregoing aspects, wherein the memory stores further output data representative of the operating parameters of the power generation performance, battery storage and/or battery discharge performance of a plurality of said discrete devices provided in a further array, said further array being disposed at a third geographic location remote from both of said first and second geographic locations, the processing assembly being actuable to compile said further output data to determine additional regional operating profiles for said further array, and compare the additional regional operating profiles and at least one of said regional operating profile and the compared device operating profile.

31. A system according to any one of the foregoing aspects, wherein said processing assembly is further operable to effect the transmission of programming signals to the device controller of said selected discrete devices to modify at least one operating configuration selected from the group consisting of a configuration of said generator, a charging schedule of said battery, a level of power flowing to at least one said associated loads, and an operating schedule of at least one of said associated loads.

32. A system according to any one of the foregoing aspects, wherein said output data signal is selected to provide a distinction between operation anomalies in said discrete device resulting from environmental conditions and operation anomalies that result of a hardware failure.

33. A system according to any one of the foregoing aspects, wherein said processing device being actuable to receive predictive near-term weather data for said first geographic region, and further wherein said processing device signals said data transmission assembly to transmit to said device controller input device programming signals in response to the received predictive near-term weather data.

34. A system according to any one of the foregoing aspects, wherein said processing device being actuable to receive and/or store predictive seasonal environmental data for said first geographic region, wherein said processing device signals said data transmission assembly to transmit programming signals to said device controller input device in response to said predictive seasonal data.

35. A system according to any one of the foregoing aspects, wherein said processing device is actuable to receive data selected from the group consisting of predictive near-term weather data for the first geographic region and predictive seasonal environmental data for the first geographic region, and wherein said processing device further outputs programming signals to the data transmission assembly to effect a change in the regional operating profile for said array in response to said received environmental data.

36. A method for using a system in accordance with any of the foregoing aspects further wherein one or more conditions and/or events are logged and compared against at least one of theoretical power generation and/or load, past power generation and/or load and remote installation power generation and/or made for conditions or events to analyze current operational performance and/or a predictive model performance.

BRIEF DESCRIPTION OF THE DRAWINGS

Reference will now be had to the following detailed description taken together with the accompanying drawings, in which.

DETAILED DESCRIPTION OF THE PREFERRED EMBODIMENTS

Figure 1:
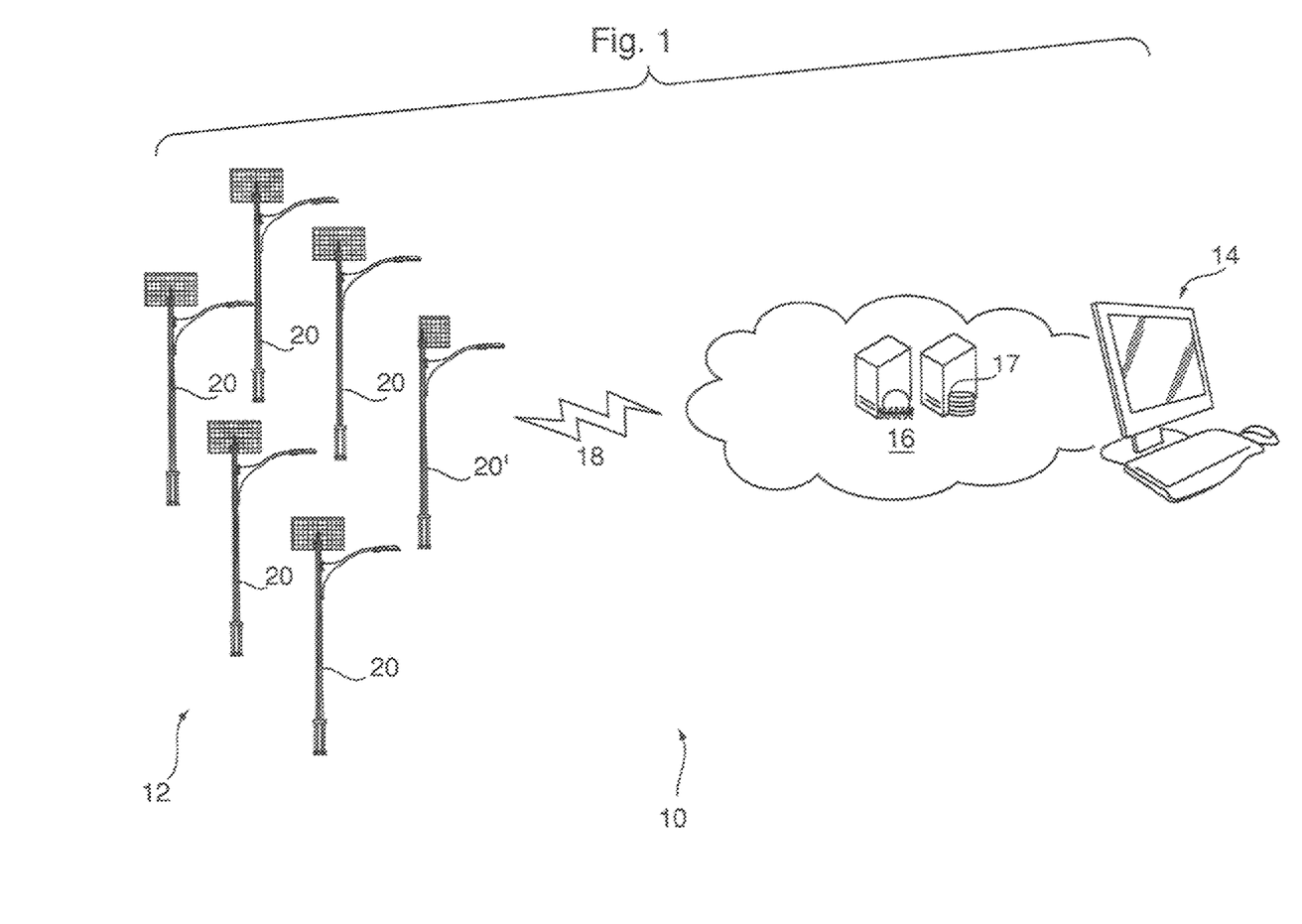
FIG. 1 shows schematically a system for the monitoring and maintenance of a remotely located autonomously powered lighting installation in accordance with a preferred embodiment.

Reference may be had to FIG. 1 which illustrates schematically a monitoring, control and maintenance system 10 for remotely located autonomously powered lighting, security/video, monitoring (weather, environmental (including pollution), industrial (flow, sewage, water) or telecommunications (cellular, WiFi, etc.) installation systems. In the embodiment shown, the system 10 includes an autonomously powered light pole array 12, a central processing unit (CPU) 14 for receiving operational data signals from and providing central signals to the array 12 and a data storage repository 16. The light pole array 12, central processing unit 14 and data storage repository 16 are most preferably provided in wireless electronic communication by a suitable cellular, Zigbee or WiFi communications network 18.

The light pole array 12 preferably consists of a number of autonomously powered light poles 20 which are installed for operations at a geographic location remote from the CPU 14. The light poles 20 forming each array 12 may optionally include at least one telecommunications aggregator pole 20', as well as a number of conventional poles 20. In particular, by reason of their autonomous power source, the light poles 20 are particularly suitable for installation in geographically remote regions which, for example, may lack conventional power infrastructure such as electrical or telephone transmission lines, or even seasonal roads. In this regard, the light pole array 12 may be situated several hundred or even thousands of kilometers from the CPU 14, not only in developed areas, but also along borders or in other geographically inaccessible areas.

Figure 2:
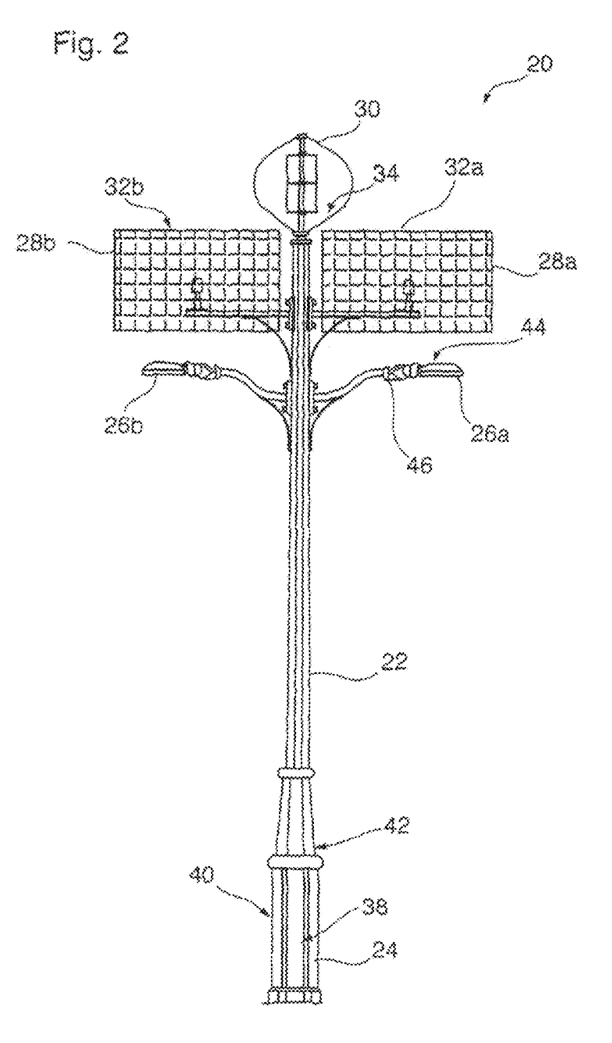
FIG. 2 illustrates schematically an autonomously powered light pole for use in the installation of FIG. 1.

FIG. 2 shows best the basic design of each light pole 20 using the system 10. The poles 20 include an aluminum column 22 which extends vertically from a hollow base 24. The column 22 is used to mount above the ground a pair of LED lights 26a, 26b as respective electric loads, as well as a pair of solar or photovoltaic panels 28a, 28b and a top mounted wind turbine generator 30. A fuel cell or battery 38 is housed within the interior of the base. As will be described, the fuel cell 38 both receives and stores charging electric current generated by the photovoltaic panels 28a, 28b and wind generator 30, and supplies a discharge electric current to the LED lights 26a,26b in response to control signals received from a pole communications and monitoring controller 42.

The photovoltaic panels 28a,28b and wind turbine generator 30 are each electronically coupled to respective voltage/current sensors 32a,32b,34. The voltage/current sensors 32a,32b,34 are operable to provide signals correlated to the voltage and electric current generated by the panels 28a, 28b and wind turbine 30 in real time. In addition to the current sensors 32a,32b,34, each pole 20 includes additional sensors for monitoring environmental and/or pole operating parameters. Optionally, a photovoltaic sensor 44 is provided to provide signals respecting ambient and/or sun light at each pole location.

Similarly a battery temperature sensor 40 within the interior of the column adjacent to the fuel cell 38 provides data relating to the battery temperature and/or ambient air temperature. In addition, optionally wind sensors may be provided as either a separate anemometer, or more preferably as part of the turbine generator 30 itself.

Figure 3:
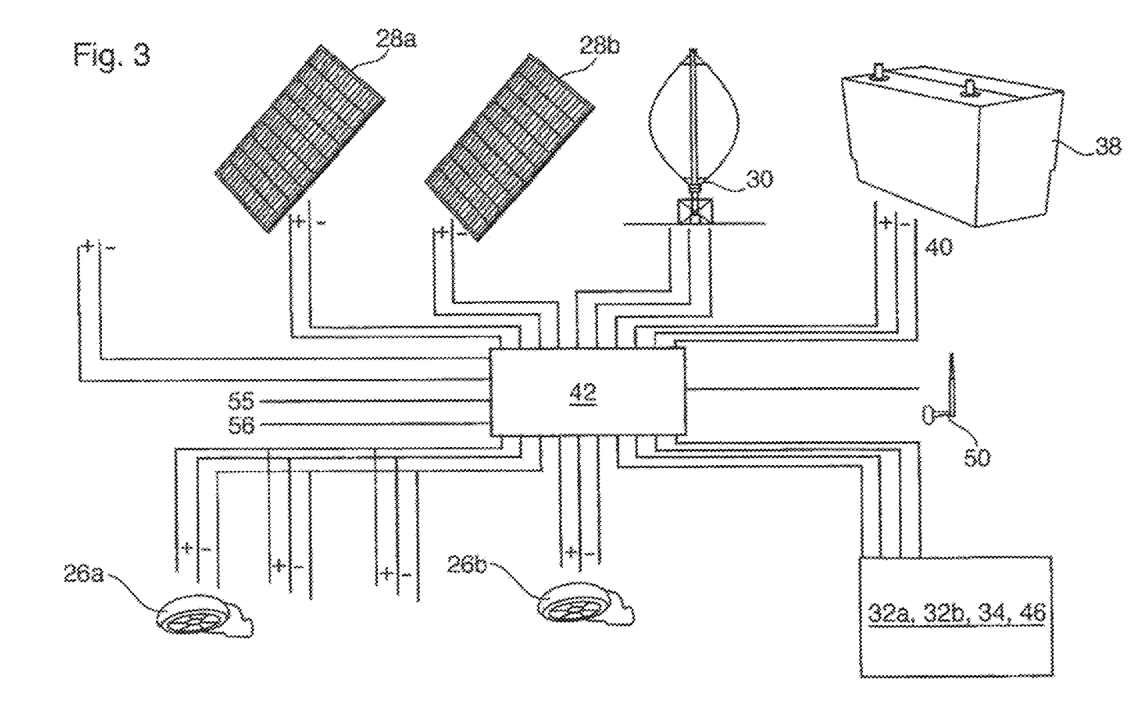
FIG. 3 illustrates schematically a light pole communication and monitoring controller used to regulate power storage and/or power to light pole loads.

FIG. 3 shows best schematically the pole communications and monitoring controller 42 as being operable to receive data signals from the sensors 32a,32b,34,44,46 and provide control signals to regulate the supply of charging current from power generation produced by the photovoltaic panels 28a,28b and wind generator 30 to the fuel cell 38, as well as battery status and the discharge supply current therefrom to the LED lights 26a,26b. Although not essential, most preferably, the communications and monitoring controller 42 further includes signal transmission and reception capability allowing the communication and/or transmission data and programming respecting the operating parameters of the pole 20, fuel cell 38 and/or load conditions between adjacent poles 20 within the light pole array 12 by either Ethernet or serial USB connections.

The telecommunications aggregator pole 20' is essentially identical to the other poles 20, with the exception in that its communications and monitoring controller 42, which includes a Zigbee, cell, Ethernet, or WIFI transmitter 50 (FIG. 3) configured to upload data and/or receive control programming from the CPU 14 for the entire array 12 via the cellular communications network 18. In one most preferred embodiment, within the light pole array 12, each pole 20 is provided with a Zigbee, cell, or Ethernet transmitter to communicate data to the data storage repository 16 directly without going through a telecommunications aggregator pole 20'. In a more economical construction, however, a single telecommunications aggregator light pole 20' is provided with the Zigbee or cell transmission capability. The light pole 20' is adapted to receive and retransmit data from the remaining light poles 20 within the array 12 to the cellular communications network.

In a further optional embodiment, the communications and monitor controller 42 may also electronically communicate with either a stand-alone weather station situated at the remote location, and/or motion detector or other environmental sensors.

Figure 4:
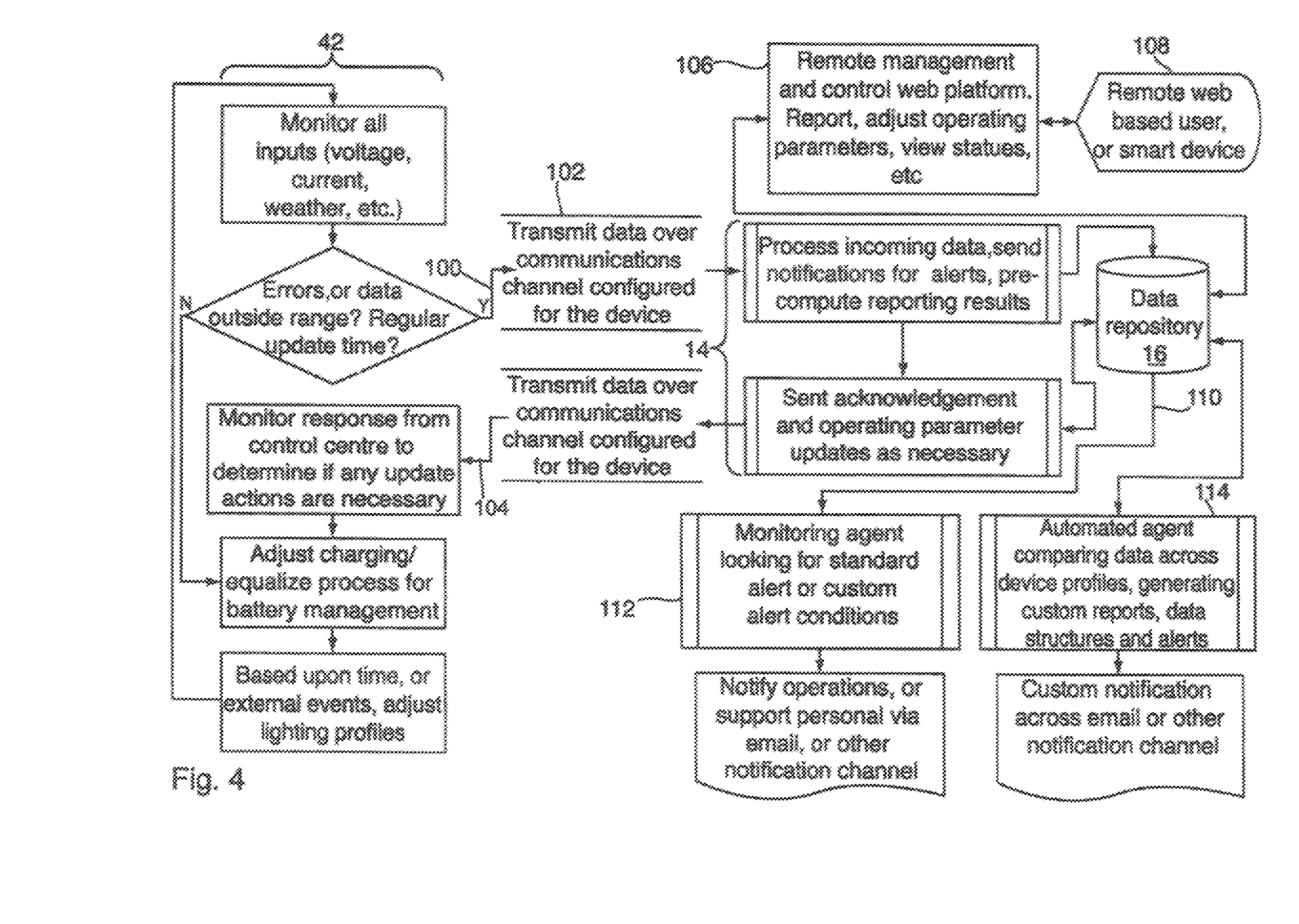
FIG. 4 illustrates a flow chart showing the monitoring and maintenance control logic for the autonomously powered lighting installation of FIG. 1.

The operation of the system 10 is shown best with reference to FIG. 4. In particular, in a most preferred mode of operation, data from the individual light poles 20 is uploaded via the cellular communications network 18 to a cloud-based processing and data storage repository 16. Although not essential, the use of a central data processing and data storage repository 16 permits multiple individual users accessing their own CPU 14 to monitor, assess and affect maintenance requirements on a number of different geographically remote light pole arrays 12. In particular, the communications and monitoring controller 42 of the poles 20 in each array 12 monitors inputs from the various sensors 32a,32b,34,44,46. This permits the system 10 to collect and monitor data respecting the voltage and current which is generated by each light pole 20, turbine 30 and photovoltaic panels 28a,28b, and record data as external factors such as temperature, wind and/or sunlight conditions at each remote region received from the photovoltaic and environmental sensors 32,32b,34,44,46.

The system 10 provides the ability to intelligently change the energy use of the individual light pole 20 loads under certain conditions to achieve lower maintenance, better performance, higher reliability and maximize the life cycle of the system.

By way of example, if a weather forecast for the next 10 days may be for cloudy weather, the system 10 may determine not enough sun will be received. The CPU 14 proactively manages energy use of the light or other system load to manage through this 'brown-out' time period.

Similarly the micro wind environment of specific locations or the sun profiles of a specific location of the pole 20 dictates lower energy generation. It is possible to change the energy use to manage it so that the system 10 delivers light at reduced hours of operations or dimmed levels to ensure the system continues to perform.

The system 10 further allows for the analysis of specific device or pole 20 performance against all of the other poles 20 ('calibration in the cloud'). Where on a select pole 20 the solar panels 28 do not operate according to the specifications or according to the expected performance relative to how the other systems are performing, or the battery does not meet specified levels, the system can change the energy use to make the pole 20 perform and meet the life cycle targets.

The life cycle of the poles 20 may evolve and change due to battery discharges and other stresses. The system 10 allows for recording of the history and performance of the system and to evolve the energy use/charging to maximize the life of the battery. Customization of the battery charging algorithms based upon environment, application and age of the system of the specific unit may also be achieved.

Most preferably, the communications and monitoring controller 42 includes an internal processor which may pre-filter the collected data to ensure that the individual operating parameters of the light pole 20 are performing within a predetermined acceptable range. Where the sensed data determines that power generation and/or load output falls outside the pre-selected ranges, the communications and monitoring controller 42 may be used to effect power reduction to the loads (i.e. dimming of the LED lamps 26a, 26b) and/or adjust the fuel cell 38 charging time accordingly.

The data received from the light pole sensors 32a, 32b, 34, 44, 46 is transmitted by the communications and monitoring controller 42 by the telecommunications aggregator pole 20', for each pole in the array 12 via the cellular and/or ZigBee communications network 18 to the data storage repository 16.

Data respecting the light pole power generation and load usage as well as environmental data for each pole 20 is stored in the repository 16 for each pole 20 of each array 12.

By means of the CPU 14, a system administrator can thus monitor power generation for the entire array 12 in aggregate, as well as on an individual light pole 20 basis. Similarly, environmental, wind generation and/or photovoltaic conditions can be aggregated for the entire pole array 12 (or part thereof) and compared against individual data on a selected pole-by-pole basis.

The system 10 thus advantageously allows a user to monitor and control individual light poles 20 having regard to not only the individual pole operating parameters, but also overall environmental conditions.

In one mode, the system 10 is used to monitor and/or control LED light operations 26a, 26b, and if necessary provide maintenance instructions as a result for a selected light pole 20. In particular, in the case of LED lights 26a, 26b, initially LED lamps have a tendency to burn with increased brightness in the first instance, characterized by a reduction in lumen output over time. As such, over the lifespan of a conventional LED bulb, the bulbs may be initially too bright, and subsequently insufficiently bright for the intended site of installation.

In one preferred mode, the CPU 14 is used to transmit control signals 104 to the communications and monitoring controller 42 to operate LED light loads 26a, 26b at reduced power levels for an initial pre-selected period. As the lamps in the LED lights 26a, 26b age, the CPU 14 controls the communications and monitoring controller 42 to increase power to the lights 26 to compensate for any reduction in performance.

In another embodiment, external data from other sources outside of the system 10 may also be loaded into the data storage repository 16 for the purposes of servicing the pole 20. In one instance, where there is an external weather forecast of severe weather with high winds, the CPU 14 may by way of communications and monitoring controller 42 modify the power draw from the wind turbine 30 and configure the turbine 30 to be best able to withstand a high wind event that could cause a failure to the system 10.

With the present system 10, the communications and monitoring controller 42 will upload to the data storage repository 16 to log historical profiles of battery performance. Depending upon the number and rate of battery charging and discharging over periods of time, the CPU 14 may by way of the communications and monitoring controller 42 modify the charging and discharging rate to and from the battery 38 with a view to extending battery life performance. In addition, depending upon environmental conditions for the pole array 12 as determined by the photovoltaic and environmental sensors 36, 46, where, for example, the geographic region where the light pole array 12 is subject to prolonged periods of either cloudiness and/or becalmed winds so as to result in a reduction of charging power to the battery, the CPU 14 may be used to signal the communications and monitoring controllers 42 of each light pole 20 within the light pole array 12 to either dim the output light intensity of the LED lights 26a, 26b and/or their operation time to compensate for regional environmental anomalies.

The present system 10 therefore allows for the remote troubleshooting and performance testing of the solar panels 28a, 28b, as well as the wind turbine 30 for each individual pole 20, by a remote web based user or smart device 108. Most preferably, the CPU 14 is operable to effect control signals to the communications and monitoring controller 42 to provide remote open voltage tests and remote short circuit tests on solar panels 28a, 28b. Similar tests for other systems components are also enable by CPU 14. By assessing the operating data stored in the data storage repository 16 for a number of light poles 20 and/or light pole arrays 12, it is therefore possible to compare individual light pole 20 performance across an aggregate number of poles to filter environmental versus hardware defects. The analysis of the performance of individual light poles 20 as compared to the aggregate of the light pole array 12 advantageously may eliminate and/or reduce needless service calls, particularly in case of the light pole arrays 12 which are installed at highly remote or physically inaccessible locations. By way of example, typically power line tree removal is currently undertaken on a ten year cycle, irrespective of whether or not an actual determination has been made whether it is needed. The present system therefore allows a system administrator to assess whether or not a number of light poles 20 in a particular array 12 are performing at a substandard level, triggering a call for intelligent maintenance when for example plant growth is adversely effecting the solar panel 28a, 28b and/or wind turbine 30 operation. It also allows for a system administrator to eliminate a scheduled maintenance operation in the event that a light pole 20 is operating according to design objectives.

Installation Diagnosis

In a first exemplary mode of operation, the system 10 is used to identify installation defects where for example solar panels are installed in an incorrect orientation or with over shading structures. By comparing individual solar panel degradation within a configuration of multiple panels, and optionally comparing the performance over a longer period of time to take into consideration the seasonal change in power, the system 10 can identify upcoming potential service issues. In another situation, where a visual inspection of pole 20 may indicate potential shading or other issues, the system may identify that such degradation does not affect the overall performance of pole 20 and therefore, no servicing action is required.

By tracking changing power output levels for each solar panel 28a, 28b over the calendar year and the change in sun position, it is possible to identify incorrectly positioned solar panels 28a, 28b and obstructions arising from seasonal changes by comparing the average solar panel output for the geographic population of the solar panel array. It is also possible to identify individual solar panels 28a, 28b that provide increasing or decreasing outputs on a seasonal basis. Seasonal change in solar output provides an indication that the changing azimuth of the sun causes the solar panels 28a, 28b to be mis-positioned where overlying obstructions may provide shadows.

In the event performance drops below predetermined thresholds, the CPU 14 is used to output a maintenance control signal to either a third party maintenance technician or alternately power down pole 20 or alter load power to preserve battery integrity.

Component Failure

In a second exemplary mode of operation, the system 10 is used to identify component defect or failure for a selected pole 20 within the array 12. The cloud 16 is used to provide a pooled performance output of the array 12, taking into consideration internal and external data point factors, on both a calendar and anticipated product lifespan basis. The CPU 14 is used to identify any individual poles 20 which are providing performance output parameters, which fall below a preselected threshold or warranty thresholds from the average performance for the array 12. In a simplified analysis, individual poles 20, which are operating below the predetermined threshold of the array 12, are identified and tagged for possible maintenance or repair. More preferably, individual pole 20 performance as well as array 12 performance is further assessed with respect to the anticipated degradation rates expected by manufacturer. In this regard, the system 10 advantageously may be used to identify arrays 12 where environmental factors have affected array 12.

Corresponding assessments may be made with respect to wind turbine 30 performance. In measuring turbine performance of an individual pole 20, the CPU 14 may be used to assess data from the cloud 16 to provide an indication of anemometer measured wind speed within the geographic region of the array 12 or alternatively a portion of the geographic region. The measured wind speed may be compared against pre-projected energy output of the mass performance of the turbines 30 to identify any individual turbines 30, which have fallen below acceptable threshold levels. In an alternate embodiment, power output data for a selected number of pole turbines 30 within a portion of the array 12 is used as a reference. Individual turbine 30 output within the sample population is then assessed for any selected poles 20 which are performing below outside threshold tolerance levels. Assessment may be made periodically and/or averaged over various time periods based upon certain factors. In an alternate embodiment, testing may be prescheduled having regard to anticipated optimum wind or environmental conditions, selected to provide the desired reference output.

In a further exemplary embodiment, battery temperature, depth of discharge and frequency of deep discharge for each battery 38 within the array 12 is recorded and stored within the cloud data repository 16, over time. The depth and frequency discharge data for individual batteries 38 may thus be compared against averages for the population and optionally adjusted for manufacturer's anticipated life span degradation to identify instances where battery 38 performance falls below acceptable performance levels. In this manner, the system 10 may be used to highlight and isolate individual poles where individual batteries may be susceptible to individual failure.

Component Life Cycle Degradation

In a further exemplary embodiment, the system 10 is operated to monitor and predict ongoing maintenance needs for the array 12 as a whole. The system 12 could be used to assess the performance of the entire array 12 against a series of further geographically remote arrays 12; as well system 10 may be used to assess an array 12 of poles 20 against the manufacturer's projected performance having regard to component age.

Scheduled Maintenance

In a further exemplary embodiment, the system 10 may be used to identify and or predict scheduled maintenance needs for individual light pole components such as solar panels 28a, 28b, batteries 38, LED lamps 26a, 26b or other load or energy generation devices.

The CPU 14 may be used to access historical data from the repository 16 to monitor the discharge supply current for each pole 20 in the individual array 12 and/or alternatively other arrays 12 of similar attributes. On a degradation of the discharge supply current for the selected array 12, CPU 14 analysis may, for example, provide an indication of dirt fouling of the solar panels 28a, 28b or lights such that systems begin to fall under manufacturer's performance projections. Data can be compared with environmental data stored on the repository 16 to provide an assessment whether or not solar panel blockage is a result of cloud or fog conditions or more direct environmental impacts such as dust or snow or alike. In the latter case, the system 10 may be used to provide a signal to remote maintenance personnel signalling that the solar panels 28a, 28b or lamps 26a, 26b may need cleaning or other maintenance. Alternatively, the system 10 can be signalled to modify the operation of the system 10 to reduce the discharge power output level and time ensuring the system 10 continues to perform for a longer period of time before the maintenance can be scheduled and delivered.

By using data stored in the repository 16 for a number of different autonomously powered light installations within similar regions, the system 10 allows for layout and performance calculations to be undertaken using theoretical calculations from tools such as Homer™. In particular, over time the system 10 will gather actual performance data for the light poles 20 within the array 12 and will permit the calculations of variance versus theoretical algorithms allowing future systems to be designed and/or tailored having regard to the actual measured performance data. More preferably, the CPU 14 will allow for the system 10 to self-learn, permitting the modification of theoretical adjustments and/or assumptions, as more and more systems 10 are brought online.

By the use of the systems 10, it is further possible to generate performance curves for the individual wind turbine generators 30. The turbine performance curves can thus permit users to monitor individual turbine power generation for a selected pole 20 as compared to the average for the entire pole array 12, allowing for an individual assessment of performance and/or deterioration.

Similarly, the system may be used to provide maintenance warnings or indications of solar or photovoltaic panel deterioration. In particular, as individual photovoltaic panels 28*a*, 28*b* become pitted and damaged, by monitoring the performance of power generated for individual poles 20 versus the entire light pole array 12, or even a regional average of photovoltaic panels for a particular area, it is possible to assess whether maintenance and/or panel replacement may be required where power generation falls below a pre-selected value.

In yet a further exemplary embodiment, the CPU 14 is operable to access third party predictive environmental data including predictive near-term data such as short term weather forecast data for the coming one to three weeks (i.e. cloud coverage, wind speeds, etc.); as well as predictive seasonal data (sunlight, solar intensity, predicted short term and/or average seasonal temperature, average wind speeds, average precipitation, etc.). In response to the predicted environmental data, the CPU 14 is operable to output control signals via the communications and monitoring controller 42, to modify load profiles including one or more of power intensity and/or time of operation of the lights and the charging and/or discharging rates to and from the battery With the embodiment, load profiles can be configured at the light pole 20 or device, or through the CPU 14. Either way, the load requirements can be determined from an energy requirements perspective in order to determine how much available energy is available on-hand in the event that energy generation is anticipated to be problematic due to upcoming weather conditions.

In one possible mode, the CPU 14 determines that the system 10 has an exemplary storage (i.e. five days' worth) of stored energy to operate, assuming the battery 38 is to provide a load profile without degradation, and may be fully recharged by average wind and/or solar output over that time period. Where the CPU 14 receives weather data predicting significant cloud cover approaching for an extended period, the CPU 14 may anticipate situations where the stored available energy on-hand may decrease, and could potentially run out.

With advance weather predictions available on the Internet, and from third parties, it is possible to predictively forecast when adverse weather conditions are to occur and adjust the operating parameters of the system 10 to extend the amount of energy available, as for example through decreased windows of light operation and/or through dimming of operational light sources.

In a mode of implementation an operating matrix for each system 10 includes a prediction model for each light 42 or load device based upon its installation GPS coordinates, time, and date. The further north or south that a light 42 or device is located will impact the seasonally maximum amount of energy generated under optimum conditions. A base level matrix may thus be utilized by the CPU 14 to determine on which days the system 10 can be expected to fully recharge batteries 38, as well as predict situations where battery charging can be compromised.

The matrix can furthermore be utilized with other diagnostic applications, as for example to determine when the system 10 is not performing as expected. It can also be utilized from a sizing perspective to design new installations to meet the changing light for each individual location, and/or provide diagnosis warning of post installation growth, obstruction, or building that was not present when the system 10 was installed and/or when solar panels 28*a*, 28*b* need cleaning due to buildup of materials on the surface of the panel (more noticeable in southern climates where solar panels are angled more horizontally in nature).

In one possible monitoring mode, the light poles 20 continuously transmit telemetry data to the CPU 14 on a user-configurable schedule. This information may for example include information about monitor sensor activation, low voltage disconnects, low voltage reconnects, etc. The light pole array data is sued by the CPU 14 for predictive analysis of the normal operating environment for each light pole 20 and/or the array 12. In situations where a motion sensor is included, the CPU 14 could collect data and determine whether the motion sensor activates repeatedly between pre-set period (i.e. the hours of 8 p.m. and 11 p.m. at an office location) which can be used to accurately predict the energy requirements at smaller time intervals.

On an hourly, daily, etc. period, the CPU 14 will update its weather parameter such as predicted wind speeds and/or predicted sunshine intensity, as for example as a weighted valve calculated by one or more of time of year, period of each system 10 based upon third party weather reporting API. The predictive model will only force changes at the light pole 20/device level when the amount of storage fails to meet the anticipated load profile and the battery charging profile required to maintain the load profile. In such a case, the CPU 14 provides a control signal to the light pole array 12 requesting a profile change to extend energy storage. The CPU 14 signals will also include recommended programming changes based on the inventory of the attached energy generation devices (solar panels 28*a*,28*b*, wind turbines 30, etc.), as well as available battery or power storage facilities.

In addition, the owner/operator of multiple systems 10 can indicate to the CPU 14 which arrays 12 and/or individual light poles 20 have a higher priority than others (security cameras, for example). This information is used by the CPU to weight the operational performance of the light poles having regard to similar weather and/or seasonal conditions and to control that a selected remote light pole 20 or device changes its operating parameters for energy conservation. In one possible mode, a security camera could be kept online as long as possible whilst other loads in the array 12 such as lighting could be dimmed and/or disabled entirely (weather sensors, etc.).

Figure 5:
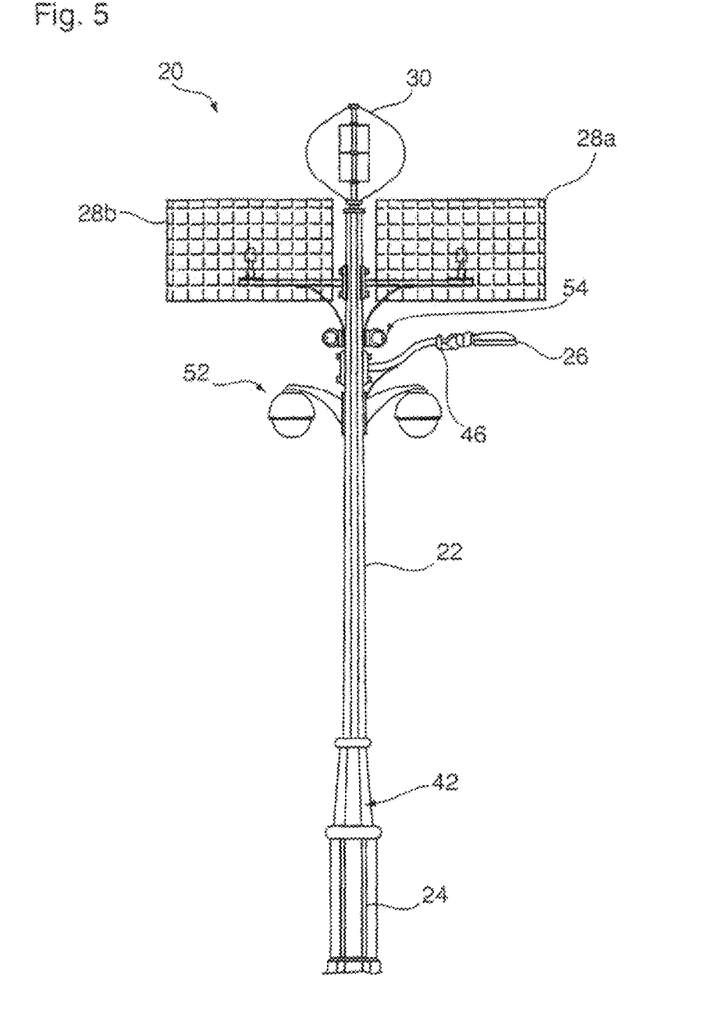
FIG. 5 illustrates an autonomously powered lighting and security camera pole for use in the installation of FIG. 1 in accordance with a further embodiment of the invention.

While FIG. 2 illustrates a preferred light pole 20 which includes as electric loads a pair of LED lights 26*a*, 26*b*, the invention is not so limited. Reference may be had to FIG. 5 which illustrates a light pole 20 in accordance with a further embodiment of the invention, in which like reference numerals are used identify like elements.

In FIG. 5, the light pole 20 is provided with a single LED light 26. In addition, as further load sources, the pole 20 is used to mount one or two video sensing cameras 52, one or two Infrared Light Sensors (likely with Photocell) 50, one or two Motion Detectors, and separate wireless router for redundant and/or secure communications. It is to be appreciated that in the embodiment shown, the communications and monitoring controller 42 is used to provide control signals to and receive control signals from the infrared light 50, the motion detector and the security camera 52, as well as receive and transmit to the data storage repository 16 and or directly to the CPU 14 video images there from.

It is believed that incorporating light poles 20 of the type shown in FIG. 5 within the light pole array 12 advantageously may be used to provide off grid security.

Figure 6:
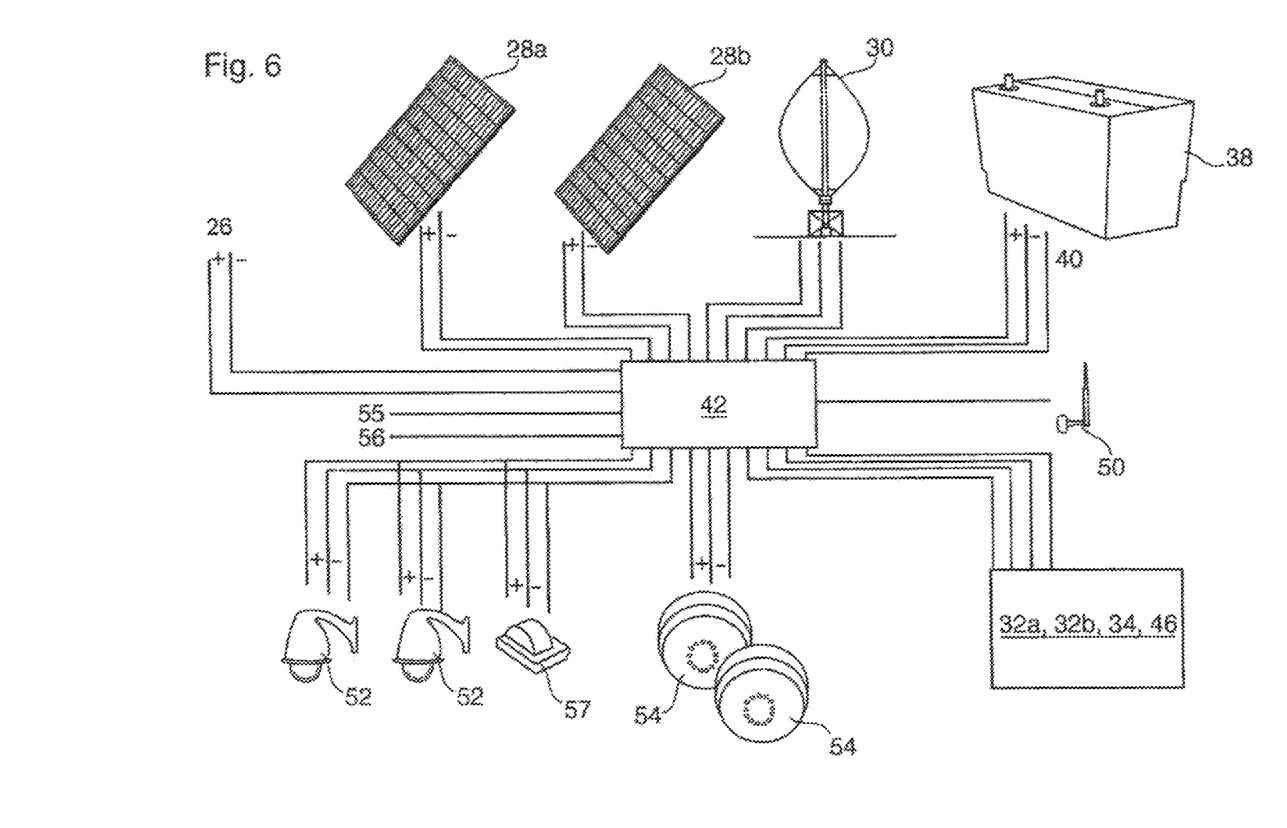
FIG. 6 illustrates schematically a security pole communication and monitoring controller used to regulate power storage and/or power to security pole loads.

FIG. 6 shows schematically the pole communications and monitoring controller 42 as being operable to receive data signals from the sensors 32a, 32b, 34, 44, 46 and provide control signals to regulate the supply of charging current from power generation produced by the photovoltaic panels 28a, 28b and the wind generator 30 to the fuel cell 38, as well as battery status and the discharge supply current therefrom to the video sensing cameras 52, infrared light sensors 57, and motion detectors 54. Although not essential, most preferably, the communications and monitoring controller 42 further includes signal transmission and reception capability allowing the communication and/or transmission of data and programming respecting the operating parameters of the pole 20, fuel cell 38 and/or load conditions between adjacent poles 20 within the pole array 12, as well as information captured by the sensing cameras 52, infrared sensors 57 and motion detectors, by either Ethernet or serial USB connections 55,56.

Although the detailed description describes the system 10 as used in the remote monitoring and control of an array of combination solar and wind powered lampposts, the invention is not so limited. It is to be appreciated that in an alternate embodiment, the system 10 could incorporate a variety of other autonomous solar powered, wind powered, other direct current or alternating current power sources and/or grid-powered devices providing a load. Such devices could include without restriction, electrically powered security cameras, radio or cellular transmitters, parking and/or utility meters, monitoring stations traffic lights, display boards or the like.

In still a further embodiment of the invention, the system could be provided with autonomous electricity generating wind turbines and/or other power generation sources in addition to, or in place of, the photovoltaic powered light poles, without departing from the current invention.

Although the detailed description describes and illustrates various preferred embodiments, it is to be understood that the invention is not limited strictly to the precise constructions, which are disclosed. Modifications and variations will now occur to persons skilled in the art.

We claim:

1. A method for monitoring and controlling an operating status of electrical loads of a plurality of autonomously powered discrete devices, and said plurality of autonomously powered discrete devices are disposed as part of a device array at a first geographic location, wherein each said device includes:
   an electric load;
   a rechargeable battery for storing and providing electric power to said electric load;
   at least one of a wind generator and a solar generator for generating electric power to be stored in said battery;
   a device controller for regulating or controlling the flow of electric power from said generator to said battery and from said battery to said electric load; and
   a data transmission assembly operable to transmit output data representative of the device operating parameters power generation performance, battery storage or discharge performance of the electric load, and to receive input control signals for said device controller controlling at least one of a charging and a discharge of said battery:

said method comprising:
      transmitting the output data from a plurality of said discrete devices for storage in a system memory,
      generating a regional operating profile for said device array for a selected time period based at least in part on compiled output data from the plurality of said discrete devices stored said system memory,
      generating a device operating profile for said selected said discrete device for said selected period of time based at least in part on compiled output data from the selected discrete device stored in said system memory,
      logging historic weather events for said first geographic location during said selected period of time, said historic weather events comprising both short term forecast data for up to three weeks and seasonal environmental data;
      receiving for said first geographical location, predicted weather events for a future period of time, said predicted weather events comprising at least one of predicted short term forecast weather data for up to three weeks, and predictive seasonal environmental data;
      correlating at least one of said regional operating profile and said device operating profile to said future period of time based on said logged historic weather events and said predicted weather events, and providing an extrapolated performance expectation for said selected device during said future period of time based on said correlation; and
      outputting modified control commands to the device controller of said selected discrete device as said input control signals to vary control of at least one of battery charging, battery discharge, and electric load operation in response to said extrapolated performance expectation.

2. The method as claimed in claim 1, wherein said autonomously powered discrete devices are rechargeable battery powered devices selected from the group consisting of a solar light pole, a security camera, a parking meter, a charging station, a bike renal platform, a display board, an environmental sensor, and a telecommunication transmitter.

3. The method as claimed in claim 1, wherein said short term forecast data comprise forecast data selected from the group consisting of sun position, wind velocity, cloud coverage, precipitation, temperature, UV intensity, fog occurrence and snow accumulation.

4. The method as claimed in claim 3, wherein said seasonal environmental data comprises data selected from the group consisting of geographic latitude, seasonal sunlight duration, average seasonal temperatures and seasonal wind speed averages.

5. The method as claimed in claim 1, wherein the data transmission assembly is selected to wirelessly receive said input control signals and wirelessly transmit said output data to a processing assembly including said memory at a second geographic location remote from said first geographic and wherein:
   each of said received predicted weather events and said logged historic weather events being stored in said memory, and said processing assembly being operated to perform said steps of compiling said output data to generate said regional operating profile and said device operating profile, and output the modified control commands as said input control signals.

6. The method of claim 5, further comprising comparing the device operating profile to the regional operating profile to effect a determination of whether power generation performances, battery storage or load output of the selected discrete device falls outside a predetermined threshold difference, and
further modifying the modified control commands to adjust battery charging and discharging in response to said determination.

7. The method as claimed in claim 1, wherein said extrapolated performance expectation comprises a performance expectation which is weighted to said device operating profile having regard to the short term forecast weather data at said first geographic region comprising at least one of predicted wind speed and predicted sunshine intensity.

8. The method as claimed in claim 7, wherein said extrapolated performance expectation comprises a performance expectation which is weighted to said device operating profile having regard to the seasonal environmental data for said device array.

9. The method as claimed in claim 1, wherein said step of outputting modified control commands comprises outputting to the device controller of the selected discrete device said input control signals to operate said electric load with increased or decreased output intensity and/or activation times in response to said predicted short term forecast weather data selected to maximize the charging/discharging battery performance during at least part of the future period of time.

10. The method as claimed in claim 9, wherein the modified control commands are selected to maximize the rechargeable battery life cycle.

11. The method as claimed in claim 9, further comprising:
comparing the device operating profile to the regional operating profile, and
further modifying the extrapolated performance expectation if the compared device operating profile falls outside a predetermined threshold difference from the regional operating profile.

12. A method for remotely controlling a selected powered device, said device comprising part of an array of a plurality of devices disposed in a device array at a first geographic location, and wherein each of said plurality of devices comprising an autonomously powered discrete device including:
an electric load;
a rechargeable battery for storing and providing electric power to said electric load;
at least one of a wind generator and a solar generator for generating power to be stored in said battery;
a device controller for regulating and controlling the flow of electric power from said generator to said battery and from said battery to said electric load; and
a data transmission assembly operable to transmit output data to a remotely located processor assembly, said output data being representative of operating parameters of the device comprising power generation performance, or battery storage and load output performance for a selected time period, and to receive and output to said device controller input control signals for controlling at least one of a charging and a discharge of said battery, said method comprising:

transmitting the output data from a plurality of said devices to said processor assembly,
with said processor assembly generating a regional operating profile for said device array over said selected time period based on compiled output data from the plurality of devices in the device array;
with said processor assembly generating, a device operating profile for the selected device over said selected period of time based on the output data from the selected device,
with said processor assembly, logging weather event data for said first geographic area over said selected period of time, said weather event data comprising at least one of short term forecast data and seasonal environmental data;
with said processor assembly, compiling predicted weather event data for said first geographic region over a future period of time, said predicted weather event data comprising a least one of predicted short term forecast weather data, and predictive seasonal forecast data for said future period of time,
correlating said regional operating profile or said device operating profile to said future period of time based on a comparison of said logged weather event data and said predicted weather event data to provide an extrapolated performance expectation for said selected device during said future period of time;
outputting modified control commands to the device controller of said selected device as said input control signals in response to said extrapolated performance expectation; and
wherein said devices comprise one or more selected from the group consisting of a solar light pole, a security camera, a parking meter, a charging station, a bike rental platform, a display board, an environmental sensor, and a telecommunication transmitter.

13. The method of claim 12, wherein the modified control commands are selected to maximize the life cycle of the battery of the selected device, having regard to the compiled predicted weather event data.

14. The method of claim 12, further comprising:
comparing the device operating profile to the regional operating profile to effect a determination of whether power generation performance, battery storage or load output of the selected device falls outside a predetermined threshold difference, and
further modifying the output modified control commands to adjust battery charging and discharging in response to said determination.

15. The method a claimed in claim 12, wherein the step of outputting said modified control commands comprises outputting to said selected device said input control signals to operate said electric load with increased or decreased output intensity or activation times in response to said predicted short term forecast weather data selected to maximize the charging/discharging battery performance during at least part of the future period of time.

16. The method as claimed in claim 15, wherein said extrapolated performance expectation comprises a performance expectation which is weighted to said device operating profile having regard to the predicted short term forecast weather data at said first geographic region for a period of up to three weeks.

17. The method as claimed in claim 16, wherein said short term forecast data is selected from the group consisting of sun position, wind velocity, cloud coverage, precipitation, temperature, UV intensity, fog occurrence and snow accumulation.

18. A method for remotely controlling a rechargeable battery powered light pole, said light pole comprising a selected one of a plurality of light poles disposed at a first geographically remote location as part of a light pole array, and wherein each of said light pole includes:
   an electric load including at least one light;
   a rechargeable battery for storing and providing electric power to said electric load;
   a power generator comprising at least one of a wind generator and a photovoltaic generator for generating power to be stored in said battery;
   a device controller for regulating the charging of the battery and the flow of electric power therefrom to the electric load; and
   a data transmission assembly operable to output to a remotely located processor assembly output data representative of operating parameters of the light pole comprising at least one of power generator performance, battery storage performance and battery discharge performance, and to receive and output to said device controller control signals for controlling battery charging by the power generator and power discharge of said battery to said electric load;
   said processor assembly being operated to:
      generate a regional operating profile for said light pole array over a selected time period by compiling on output data from the plurality of light poles in the light pole array, wherein said regional operating profile comprises aggregate power generator performance and aggregate battery storage or discharge performance of said pole array,
      generate a device operating profile for said selected light pole over the selected time period based by compiling output data from the selected light pole, said device operating profile comprising power generator performance and battery storage and/or discharge performance of said selected light pole;
      store weather event data for said first geographic region over the selected time period, said weather event data comprising at least one of short term forecast data and seasonal environmental data;
      compile predicted weather event data for said first geographic region over a future period of time, said predicted weather event data comprising at least one of predicted short term forecast weather data, and predictive seasonal forecast data for said future period of time,
      correlate performance data from at least one of said regional operating profile and said device operating profile to said future period of time based on a comparison of said stored weather event data and said predicted weather event data to provide an extrapolated performance expectation for said selected light pole during said future period of time; and
      output modified control commands to the device controller of said selected light pole as said control signals in response to said extrapolated performance expectation, wherein the modified control commands are selected to maximize battery charging/discharging performance during at least part of said future period of time.

19. The method as claimed in claim 18, wherein said short term forecast data comprise forecast data selected from the group consisting of sun position, wind velocity, cloud coverage, precipitation, temperature, UV intensity, fog occurrence and snow accumulation, for a period of up to three weeks, and
   wherein seasonal environmental data comprises data selected from the group consisting of geographic latitude, seasonal sunlight duration, seasonal average temperatures and seasonal wind speed averages.

20. The method as claimed in claim 19, wherein said extrapolated performance expectation comprises a performance expectation which is weighted to said device operating profile having regard to the seasonal environmental data for said light pole array.

21. The method as claimed in claim 18, further comprising:
   comparing the device operating profile to the regional operating profile, and
   further modifying the extrapolated performance expectation if the compared device operating profile falls outside the predetermined threshold difference from the regional operating profile.

22. The method as claimed in claim 18, wherein the selected time period comprises a historic period of time.

23. The method as claimed in claim 22, further comprising generating a current operating profile for the selected light pole over a current period of time, comparing the current operating profile, to at least one of the device operating profile over the selected time period and the regional operating profile to effect a determination of whether power generation performance, or battery storage or discharge of the selected light pole falls outside a preselected range, and
   further modifying the output modified control commands to the device controller of the selected light pole to adjust battery charging or discharging in response to said determination.

* * * * *